(12) United States Patent
Bierer

(10) Patent No.: US 8,970,204 B1
(45) Date of Patent: Mar. 3, 2015

(54) LONG RANGE PHASING VOLTMETER

(71) Applicant: Walter S. Bierer, Blythewood, SC (US)

(72) Inventor: Walter S. Bierer, Blythewood, SC (US)

( * ) Notice: Subject to any disclaimer, the term of this patent is extended or adjusted under 35 U.S.C. 154(b) by 235 days.

(21) Appl. No.: 13/741,543

(22) Filed: Jan. 15, 2013

(51) Int. Cl.
*G01R 25/00* (2006.01)
(52) U.S. Cl.
CPC ....................................... *G01R 25/00* (2013.01)
USPC .............. 324/76.77; 324/66; 324/85; 324/86; 318/400.21; 375/213; 375/356; 379/93.37
(58) Field of Classification Search
CPC .... G01R 25/00; G01R 29/18; G01R 19/2513; G01R 31/343
USPC .................................. 324/76.77, 66
See application file for complete search history.

(56) References Cited

U.S. PATENT DOCUMENTS

| | | | | |
|---|---|---|---|---|
| 3,027,523 | A * | 3/1962 | Wilcox | 332/171 |
| 4,626,622 | A * | 12/1986 | Bouvrette | 379/93.37 |
| 5,510,700 | A * | 4/1996 | Pomatto | 324/66 |
| 6,130,531 | A * | 10/2000 | Hao | 324/85 |
| 6,459,252 | B1 | 10/2002 | Bierer | |
| 6,617,840 | B2 | 9/2003 | Bierer | |
| 6,642,700 | B2 * | 11/2003 | Slade et al. | 324/66 |
| 6,734,658 | B1 | 5/2004 | Bierer | |
| 7,109,699 | B1 | 9/2006 | Bierer | |
| 7,808,228 | B1 | 10/2010 | Bierer | |
| 8,283,911 | B1 | 10/2012 | Bierer | |
| 8,724,760 | B2 * | 5/2014 | Grobert et al. | 375/356 |
| 2003/0169029 | A1 * | 9/2003 | Piesinger | 324/66 |
| 2004/0263147 | A1 * | 12/2004 | Piesinger | 324/86 |
| 2006/0259806 | A1 * | 11/2006 | Zweigle et al. | 713/400 |
| 2007/0063664 | A1 * | 3/2007 | Rhodes et al. | 318/439 |
| 2010/0194378 | A1 * | 8/2010 | Kim et al. | 324/76.77 |
| 2011/0181269 | A1 * | 7/2011 | Watkins et al. | 324/76.77 |
| 2013/0287067 | A1 * | 10/2013 | Grobert et al. | 375/213 |

* cited by examiner

*Primary Examiner* — Benjamin M Baldridge
(74) *Attorney, Agent, or Firm* — Michael A. Mann; Nexsen Pruet, LLC

(57) ABSTRACT

A wireless phasing voltmeter determines the phase difference between the voltage carried by a reference electrical conductor and a field conductor. The voltage signal from the reference conductor is detected by a first unit and compared to a precision 60 Hz wave form generated from a first 1 pps GPS signal. The phase difference between the wave form and the reference conductor, represented by nine data bits, is used to modulate a radio frequency carrier wave and transmitted via simplex transmission to a second unit near an electrical conductor in the field. The second unit receives the modulated carrier wave, decodes the phase angle difference and compares it to a second phase angle difference between the voltage on the field conductor and a second precision 60 Hz wave form generated from a second 1 pps GPS signal. The difference between the two phase differences determines the phase of the field conductor.

12 Claims, 3 Drawing Sheets

LONG RANGE PHASING VOLTMETER

RELATED PATENTS

The present application is related to commonly-owned U.S. Pat. No. 7,808,228, U.S. Pat. No. 8,283,910, and U.S. Pat. No. 8,283,911, which are incorporated herein in their entirety by reference.

BACKGROUND OF THE INVENTION

The present invention relates generally to high-voltage phasing meters and, in particular, to long-range wireless phasing meters that use communications links to transfer data.

Three-phase high-voltage distribution and transmission lines consist of three energized conductors and a fourth, neutral or "ground" conductor. The three energized conductors each carry an electrical voltage that varies in magnitude at the same frequency but the phase of the voltage carried by each conductor is displaced by a phase angle of 120 degrees. The conductors carrying these three differently-phased voltages are generally labeled as the A, B, C or 1, 2, 3 conductors, or equivalent depending on the utility, to tell them apart. In the simplest arrangement, the first phase, or reference phase, is arbitrarily designated to be 0 degrees, making the next phase 120 degrees displaced from the first and the last phase 240 degrees displaced from the first.

When two sets of high voltage distribution and transmission lines are to be connected, the phases of each line must match. In total, there are six possible ways to attach any two sets of three conductors. Each of these six different connections will result in a different outcome for the device being powered, an outcome that may be significant. Incorrectly-wired three-phase transformer banks, consisting of three individual transformers, for example, can produce phase angles between 0 and 360 degrees in 30 degree steps. Accordingly, phase identification prior to connecting conductors is important to those who maintain high voltage distribution and transmission systems.

Unfortunately, the phase identity of individual conductors may get lost in overhead distribution and transmission systems. In underground electrical systems, which may extend for many miles, the phase identification ascribed to individual conductors is not always correct. Unauthorized digging or trenching up of an underground electrical system, which is a common occurrence, may sever conductors and result in loss of phase identification. Also, natural disasters such as accidents, hurricanes, tornadoes, forest fires, high winds, snow, ice, earthquakes, floods, etc. may result in loss of phase identification in above-ground and even in underground transmission systems. Mapping, phase tagging and verification of system records for both above-ground and underground electrical systems require accurate phase identification.

Determining the time varying voltages of two conductors is part of the measurement but when the conductors are far enough apart, the fact that they are separated will introduce errors into the comparison of the two measurements. Eliminating, correcting or avoiding those errors is vital to correctly connecting separated conductors. Achieving these objectives with a minimum use of communications bandwidth and a minimum amount of data transfer may have advantages.

Measuring the phase difference between the voltages on electrical conductors per se is known. One system is disclosed in U.S. Pat. No. 6,642,700 issued to Slade et al and assigned to Avistar Inc. This system identifies phase angles of electrical conductors at remote locations by measuring the time delay between an external clock source and a zero crossing of the wave form. A time tag is associated with that time delay and transmitted over a full-duplex communications link between a field unit and a reference unit. At the reference unit, the phase angle is calculated and displayed. The Avistar system uses the global positioning satellite (GPS) system as its external clock for determining the time delay. In order for this system to operate in real time, it requires either a half-duplex or full-duplex, full-time communications link of relatively high speed to transfer all of the time tag and overhead voltage information.

Another phase angle measurement system is described in U.S. Pat. Nos. 6,734,658 and 7,109,699, issued to the present inventor. In this system, a signal, corrected for capacitive charging currents, is obtained by a master probe measuring the voltage carried by a conductor in the field. The phase of a signal from the master probe is compared to the phase of another signal transmitted wirelessly and in full duplex from a supplemental probe that measures a reference voltage. The phase difference is displayed by the master probe. This system compensates for the phase shift introduced when a signal is sent from one probe to the other. The transmitted voltage signal is encoded onto a carrier wave by modulating that wave with the voltage information itself. This system also requires the use of a full-time half- or full-duplex communications channel of relatively high speed.

A third system is described in U.S. Pat. Nos. 6,734,658, 7,808,228, 8,283,910, and 8,283,911, issued to the present inventor. In this system the phase of a voltage carried by a reference conductor is measured by a reference probe and compared to the phase of a precision 60 Hz wave form generated from a GPS receiver signal. The phase difference between these two waves, in the form of a nine-bit data signal is transmitted over a distance, perhaps miles, to a receiver that decodes the data signal and uses another precision 60 Hz wave form generated by another GPS receiver to re-create a surrogate wave identical to the original reference voltage. This surrogate wave is forwarded to a (nearby) meter probe that is measuring the voltage on a field conductor. The meter probe can then compare the two waves to determine the phase angle difference between them. This system is an improvement over the previous two systems relating to the communications requirements since it only requires a low-speed, simplex data channel.

These three prior art systems thus use different ways of obtaining signals that represent the phases of the voltages carried by of the reference and field conductors for comparison and have different communications requirements. The Avistar system compares time tags of the field and reference voltage signals, wherein the time tag of each is the difference between a GPS time and the zero crossing time of the alternating voltage, to determine the phase difference between the two time-varying voltages.

The first Bierer system compares the phase of the reference conductor voltage to that of the field conductor voltage directly but compensates for the phase shift of the transmitted reference voltage resulting from the transmission distance to the master probe measuring the field conductor voltage.

The second Bierer system determines the phase angle between a reference conductor voltage and a precision 60 Hz wave form generated from a GPS signal. This phase angle is transmitted to a distant receiver where a surrogate of the original reference conductor voltage is being re-created. The surrogate is then compared to the phase of the voltage carried by a field conductor.

There remains, however, a need for high voltage phasing voltmeter that is accurate, easy to read and useable when the high voltage distribution or transmission lines are separated by many miles and that does not depend on high quality data communications channels.

SUMMARY OF THE INVENTION

According to its major aspects and briefly recited, the present invention is a long-range, wireless, phasing meter system that determines the instantaneous phase angle difference between the voltages carried by two electrical conductors that may be separated by many miles using a communications channel, even a marginal communications channel such as a simplex communications system would provide, with minimal data transfer requirements. To make that determination, two voltage signals, each one of them containing phase information associated with each conductor, are generated and then compared to each other. One of the signals is transmitted by a first or reference unit and represents the phase angle difference between the voltage on a reference conductor and that of an artificial wave form based on a universal standard frequency. The other of the signals is generated by a second or field unit and represents the phase angle difference between the voltage on a field conductor and that of an artificial wave form based on the same universal standard frequency. The phase angle difference between the two phase angle difference signals, which is determined at the second unit, is the same as the phase angle difference between the two conductors.

The terms reference conductor and field conductor are used herein to refer to a conductor arbitrarily designated as the reference against which another conductor (i.e., the field conductor) is compared. The present system may be used, for example, to identify any conductor in a utility system with respect to a single conductor arbitrarily chosen as the reference conductor. In this case, there would be one reference conductor and all other conductors would be field conductors.

The term phase difference and phase angle difference will be used interchangeably because phase difference is often expressed as an angle between zero and 360 degrees. However, regardless of the manner in which phase angle difference is expressed, degrees, radians or otherwise, the present invention determines phase angle difference and displays it in a convenient manner for the user.

A voltage on a conductor is assumed to be a time-varying voltage, that is, the time-varying voltage of an alternating current system which has a frequency. A voltage signal is an analog or digital representation of that voltage.

The designations of first unit and second unit are also somewhat arbitrary but, for convenience, the first unit is the unit near the reference conductor. The second unit, that is, the one being used by a technician at a location away from the first unit and first conductor, is the unit used determine the phase difference between the voltage on a conductor in the field (i.e., away from the reference conductor) with the voltage of the designated reference conductor.

The reference and field conductors do not have to be separated by a great distance but may be separated by any distance as long as there is at least a minimal telecommunications link between them.

Both the first and second units have the capability of receiving a GPS signal of one pulse per second and generating a wave form that has a frequency of 60 Hertz (Hz) from that signal. They both have the capability to compare the generated wave form with a 60 Hz AC voltage signal from a conductor to determine the phase difference between the two. The first unit includes the capability to transmit, via a telecommunications link, the phase difference as a telecommunications signal to the second unit; the second unit has the capability to receive that phase difference transmission, and to extract that phase difference from the received telecommunications signal. The second unit also has the capability to compare that phase difference received from the first unit to that generated by the second unit and to display the difference between the two phase differences.

The term telecommunications link or communications link are used herein interchangeably to refer to a means for transmitting information, which may be wireless, or partially wireless and uses a carrier wave to send the information as a digital or analog, or combination digital and analog signal.

At least the second unit includes a field probe that can detect the voltage from the field conductor and generate a voltage signal from that detected voltage. The first unit may have a first probe that can detect the voltage from the reference conductor and generate a reference voltage signal from that detected reference voltage. The first unit may be close to the reference probe; the second unit may be close to the field probe.

In order to generate the signal to be transmitted from the first unit to the second unit, the first unit receives GPS signals of one pulse per second and uses those periodic pulses to construct a wave form with a sixty-cycle-per-second frequency. It then determines the instantaneous phase difference between this constructed wave form and the first signal. The phase difference between the first complete single cycle of the constructed wave form and the first signal is transmitted to the second unit. Because the phase difference is simply a number between 0 and 360, it can be transmitted using a mere 9 bits. The encoded, instantaneous phase difference is transmitted from the first unit to the second unit following receipt of the standard second. The second signal, which is received by the second unit and which is from the second source, is the 60 Hz phase information of the conductor in the field. The second unit first computes the second instantaneous phase difference between the first complete single cycle of a second precision frequency (serving again as a universal standard 60 Hz frequency following receipt of the standard second) and the first complete cycle of the 60 Hz frequency of the second signal from the second reference probe. The second unit then calculates the difference between the first and second instantaneous phase differences to determine the difference in the phase between the first voltage signal from the reference conductor and the second voltage signal from the electrical conductor in the field. The two instantaneous phase differences can be obtained by comparing wave forms to voltage signals or by comparing voltage signals to wave forms but must be done consistently between the reference and the field voltages.

The preferred choice for the known frequency is derived from the global positioning satellite clock frequency, but not for its value as a source of the time or for measuring a time interval between two moments in time, but for the convenience of the precision frequency of the pulses GPS provides simultaneously everywhere. The GPS 1 pps "standard second" signal, conveniently, can be used to create a precision 60 Hz frequency signal for use in the present application for comparison with 60 Hz electrical transmission frequencies.

An important feature of the present invention is the transmission of the instantaneous phase difference, which may be transmitted only once per second following the 1 pps standard second frequency. The length of time required for this transmission may be on the order of milliseconds, because the phase difference is a number between 0 and 360 and thus requires only nine bits of data to be transmitted. The remainder of the time the communication channel may be idle. A greater or smaller number of bits may be transmitted depending on the desired resolution. This feature allows the transfer of 100% of the phase information via a part time, one-way, simplex communication link between the first unit and the second unit requiring this minimal throughput data rate as opposed to either a full-time, simplex or a full-duplex communications system requiring a much higher throughput data rate, as taught by the prior art.

Another important feature of the present invention is the use of GPS clock frequency to generate a phase angle difference with a voltage signal. The GPS 1 PPS clock frequency is used in the present invention to create a new precision frequency signal that has the same frequency as the voltage frequency on an electrical conductor so that their phase difference is always between 0 and 360 degrees. Just as important, the GPS clock frequency received by the first unit is in phase with that of the second unit regardless of the number of miles separating them; that is, a GPS pulse rises at all locations at the same time. Accordingly, no distance-dependent adjustment is required.

These and other features and their advantages will be apparent to those skilled in the art of electric utility high voltage measurements from a careful reading of the Detailed Description of the Invention accompanied by the following drawings.

BRIEF DESCRIPTION OF THE DRAWINGS

In the figures.

DETAILED DESCRIPTION OF THE INVENTION

Figure 1:
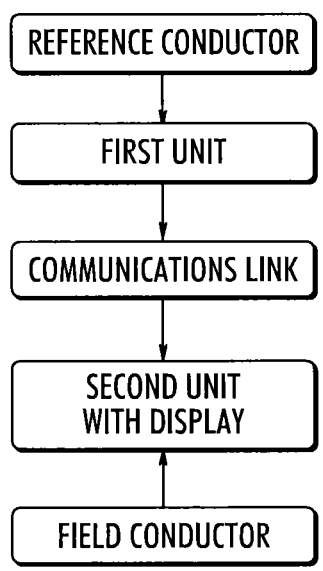
FIG. 1 is a simplex radio communications system connecting a first unit and a second unit for measuring phase angle difference between a reference and a field conductor, according to an embodiment of the present invention.

The present invention is a long range phasing voltmeter system that is an improvement over existing long range phasing voltmeter systems. The improvements lie in the system's ability to use even a marginal communication channel with minimum data speed and throughput requirements in accurately determining multiple parameters of an electrical system, such as phase, phase angle, phase sequence, and phase rotation, when the electrical conductors may be separated by a distance of many miles.

The present invention may be applied to elements of the phasing voltmeter system disclosed and described in U.S. Pat. No. 6,734,658 that includes a supplemental probe, as well as commonly-owned U.S. Pat. No. 7,808,228, U.S. Pat. No. 8,283,910, and U.S. Pat. No. 8,283,911, to which the present invention is related.

The supplemental probe of U.S. Pat. No. 6,734,658 measures the time-varying voltage on the reference conductor. The term "supplemental probe" as used in U.S. Pat. No. 6,734,658 is replaced herein with the term first, or reference, probe, which first probe measures the voltage on an arbitrarily-designated reference conductor. Alternatively, in the present invention, the first probe may be replaced with a hardwired configuration based on the designation of a single voltage signal as a system-wide reference source. Under these circumstances no reference probe, in the sense of a measuring device, is needed; rather, merely a "reference source" of a voltage signal that is equivalent to the information transmitted by the supplemental probe in U.S. Pat. No. 6,734,658. For convenience, when the term reference source is used herein, it includes either a first reference probe in contract with a reference conductor or a hard-wired configuration of a reference voltage signal.

Typically, the utility worker may wish to know if a conductor in the field can be connected to a reference conductor or, alternatively, what the phase angle differences are among several field conductors are so that those of the same phase can be safely connected to each other. It is also possible that the utility worker may wish to know the phase of any conductor with respect to the utility's reference source.

The present invention is a method of determining the phase angle difference between a voltage signal carried by an electrical conductor in the field and a reference voltage signal. The method includes the steps of (a), from a location near a reference source such as a reference conductor, receiving a first 1 pps signal from a first global positioning satellite: (b) generating a first wave form from the first 1 pps signal; (c) obtaining a voltage signal from the reference source; (d) determining a first instantaneous phase difference between the first wave form and the voltage signal from the reference source; (e) at a location near a field electrical conductor, receiving a second 1 pps signal from a second global positioning satellite; (f) generating a second wave form from the second 1 pps signal; (g) obtaining a field voltage signal from said field electrical conductor; (h) determining a second instantaneous phase difference between the second wave form signal and the field voltage signal; and (i) determining a phase angle difference between the first and second instantaneous phase differences, the phase angle difference between the first and the second instantaneous phase angle differences being the phase angle difference between the voltage signal of the reference source and the field voltage signal of the field electrical conductor. The method may also include, (a) at the reference location, modulating a carrier wave with the first instantaneous phase difference; (b) transmitting the modulated carrier wave to the location near the electrical conductor; (c) receiving the modulated carrier wave at the location; and (d) demodulating the carrier wave to obtain the first instantaneous phase difference at the location. The method may also employ a carrier wave that is a radio frequency wave and modulating the carrier wave may include applying the first instantaneous phase difference as an audio spectrum signal to the radio frequency carrier wave. The audio spectrum signal may be a nine-bit digital code transmitted at intervals one second apart via a simplex communications system.

The present invention is also a system for determining the phase angle difference between a voltage carried by an electrical conductor in the field and a reference voltage. This system comprises (a) a first unit in electrical connection with a time-varying reference voltage, the first unit having a first GPS receiver producing a one pps signal, a first universal frequency source generator generating a first wave form from the one pps signal, and a first phase angle comparator determining a first instantaneous phase angle difference between the first wave form and the reference voltage; and (b) a second unit near an electrical conductor, the second unit having a source generating a voltage signal representing a time-varying voltage carried by the electrical conductor, a second GPS receiver producing a one pps signal, a second universal frequency source generator generating a second wave form from the one pps signal from the second GPS receiver, a second phase angle comparator determining a second instantaneous phase angle difference between the second wave form and the voltage signal generated by the source, and a third phase angle comparator determining the phase angle difference between the first and second instantaneous phase angle differences, the phase angle difference between the first and second instantaneous phase angle differences being the phase angle difference between the voltage on the electrical conductor and reference voltage.

The system includes an encoder in electrical communication with the first phase angle comparator and carried by the first unit, the encoder encoding the first instantaneous phase angle difference and outputting a digitized phase angle signal; a modulator carried by the first unit and in electrical connection with the encoder, the modulator modulating a carrier wave with the digitized phase angle signal; a transmitter carried by the first unit for transmitting the modulated carrier wave; a receiver carried by the second unit for receiving the carrier wave transmitted by the transmitter; a demodulator carried by the second unit and in electrical communication with the receiver, the demodulator outputting the digitized phase angle signal; and a decoder carried by the second unit and in electrical connection with the demodulator, the decoder decoding the phase angle signal and outputting the instantaneous phase angle difference from the first unit to the third phase angle comparator.

The system's carrier wave may be a radio frequency carrier wave and the modulator may modulate the carrier wave using an audible signal. The system's transmitter may a simplex transmitter and may transmit the modulated carrier wave at a regular intervals which may be one second apart. The phase angle difference may be represented by nine or fewer digital bits.

Figure 2:
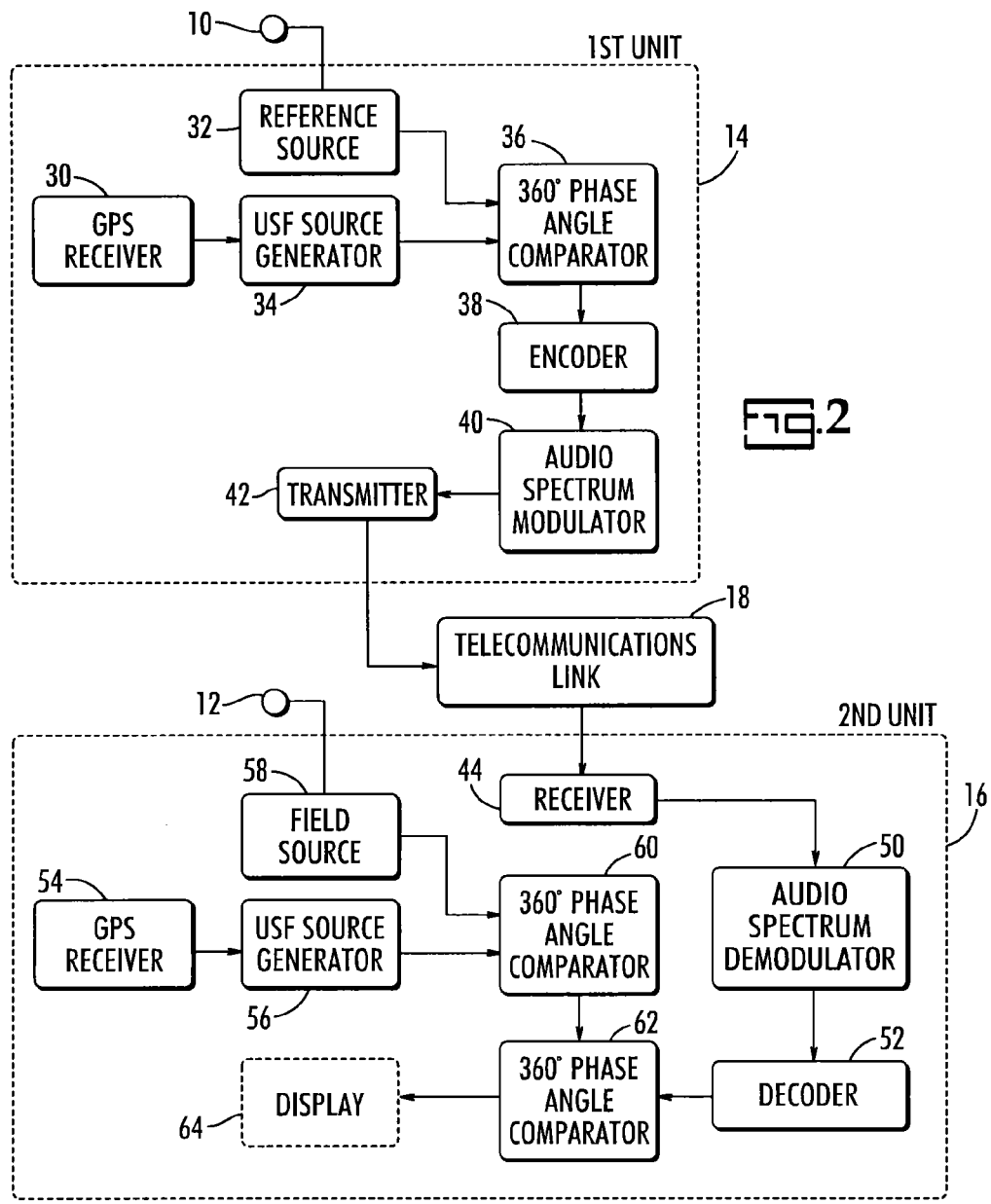
FIG. 2 is a schematic description of the first unit and second connected by a simplex telecommunications link, according to an embodiment of the present invention.

Referring now to the figures, FIG. 1 illustrates the present improved phasing voltmeter system, according to an embodiment of the present invention. FIG. 2 shows a schematic view of the invention to include a first reference conductor 10 and a field conductor 12, and, between them, a first unit 14 and a second unit 16 in communication via a telecommunications link 18. First unit 14 and second unit 16 may include probes as described in U.S. Pat. No. 6,734,658 (allowing for the changes in terminology previously described) that measure the voltages of first conductor 10 and second conductor 12, respectively, and produce corresponding digital or analog voltage signals. First and second units 14, 16, may be separated by a distance, perhaps a distance of many miles. Indeed, that is the point: voltages from the reference and field conductors 10, 12, may be compared to determine their phases and phase angle difference without regard to the distance between them and without a correction that is a function of that distance, just as if they were in close proximity notwithstanding the distance between them. The two units 14, 16, may communicate through any type or class of telecommunications link 18, including one using a wireless signal, preferably a radio frequency signal, that permits the signal to be transmitted accurately over long distances despite objects and topographic features that exist between probes 10, 12. That telecommunications link need only be a simplex system as it needs to transmit in only one direction for the present invention to operate.

First and second units 14, 16, cooperate with each other to allow the phase information from the reference and field conductors 10, 12, to be put into a simplified form so that it can be transmitted by pulsed simplex rather than full-time simplex or duplex transmission equipment.

Referring again to FIG. 2, first unit 14 obtains a frequency signal from a known standard frequency source, preferably the global positioning satellite (GPS) system via a GPS receiver 30 and a voltage signal from a reference source 32, such as a probe, measuring the voltage on reference conductor 12. This GPS source generates a steady and accurate pulse each second that can be received nearly everywhere on earth. That frequency of 1 pulse per second (1 PPS) received by GPS receiver 30 is used to generate a first single cycle of a precision 60 Hz signal in the 60 Hz universal standard frequency source generator 34 in order to very nearly match the frequency of the 60 Hertz frequency of the AC voltage carried by the reference conductor 10. This single cycle of the precision 60 Hz signal is fed into a phase angle comparator 36.

GPS receiver 30 is an inexpensive, off-the-shelf item capable of providing a stream of pulses at the rate of 1 pps synchronized to the standard second, plus or minus 1 microsecond, and referenced to Universal Standard Time. Any number of these 1 pps GPS receivers will produce output pulses that will all rise in unison, regardless of where they are on earth. The 60 Hz (and 50 Hz) Universal Standard Frequency Source ("USFS") is a term used to describe generator 34. It is a microprocessor with its own precision internal clock used to generate a local precision frequency source of 60.00000 Hz (or 50.00000 Hz in locations where the electrical transmission frequency is 50 Hz). The number of zeros represents its precision. The 60 Hz USFS generator 34, as described herein, becomes a new standard since it is based on the 1 pps output of the GPS receiver, and is not merely synchronized with the GPS signal. Each cycle of the 60 Hz USFS generator 34 output will have the same frequency and phase regardless of where it is anywhere on earth when it is receiving the 1 PPS signal from a GPS receiver 30.

The output of the 60 Hz USFS generator 24 is a single wave form that may be sinusoidal or have some other shape, but preferably has a shape that has a fairly steep rising edge such as a square pulse or saw-tooth pulse.

The first single cycle of this 60 Hz USFS signal from generator 34 may be compared using phase angle comparator 36 to a first single cycle of the 60 Hz wave form from reference source by phase angle comparator 36 to determine the phase angle difference between the two. That first phase angle difference may be used to modulate an audible signal by a frequency shift keying generator using frequency shift keying, preferably in the audible range of 1200 and 2200 Hz for the digital pulses. Alternately, the pulsed data stream containing the phase angle difference information is of such short duration that it may be converted to synthesized speech or dual-tone multi-frequency (DTMF) whereby the first phase angle numbers between 0 and 360 degrees are audibility transmitted once each second enabling transfer of data over communications channels that may restrict or limit data transmission.

Note that the time signal from the GPS system is not needed, either to mark the time or to mark a difference between two instants in time. Rather, phase angle comparator 36 continually measures the actual phase angle between a single cycle of the 60 Hz USFS derived from the 1 pps GPS signal and a single cycle of 60 Hz reference frequency derived from the power grid. This measured first phase angle difference must lie between 0 and 360 degrees. It is that phase difference that characterizes the phase of the transmission from reference conductor 10 to first unit 14 and hence the voltage wave riding the reference conductor. Nine digital bits can represent a decimal number from 0 to 511 with 1 degree of resolution ($2^9-1=511$). A mere nine bits of data transmitted once per second will contain all of the information necessary to obtain all of the desired measurements relating to phase, phase angle, phase sequence, and phase rotation. A greater or smaller number of bits may be used depending on the desired resolution. The first phase difference obtained by phase angle comparator 36 is expressed in parallel digital data form.

Encoder 38 provides the nine bits of parallel phase angle digital data and converts them into serial data using audio frequencies using frequency shift keying (FSK), dual tone multi-frequency (DTMF), Audio Frequency Spread Spectrum (AFSS), or synthesized speech so that the data may be used by modulator 40 to modulate any means of transmitting audio signals over long distances using any type or class of telecommunications link including telephone lines, cellular signals and satellite communications such as a radio frequency carrier wave. The modulated carrier wave is transmitted by a transmitter 42.

First unit 14 may include an adjustable phase shifter (not shown) that allows the user to arbitrarily set the signal of the reference source to any angle between 0° and 360°. If the reference conductor is known to be the "B" conductor, an adjustable phase shifter can be set to 120 degrees so that any field conductor in phase with the reference conductor will be a "B" conductor and any conductor 240 degrees out of phase with the B conductor is an A conductor. The phase angle adjuster thereby allows the electric utility to select which phase in its system it wants to establish as the leading, or A, phase.

A receiver 44 receives the carrier wave and forwards it to an audio spectrum demodulator 50 in second unit 16, as seen in FIG. 2, receives the transmission from first unit 14 via communications link 18, still in audio form, and demodulates the carrier wave, and then uses a decoder 52 to decode the first phase difference data from serial form to parallel form. Meanwhile, second unit 16, in the same manner as first unit 14, receives a second 1 PPS GPS frequency signal from a GPS receiver 54 and uses another 60 Hz USFS generator 56 to generate a second, precision 60 Hz signal identical in both frequency and phase to that generated by generator 34 of first unit 14.

Also, just as in first unit 14, the 60 Hz voltage from field conductor 12 is being received by field source 58 and fed into a 360 degree phase angle comparator 60 along with the precision 60 Hz signal generated from the 1 pps GPS signal, generating a phase angle difference. This phase difference generated in second unit 16 is then fed into a second 360 degree phase angle comparator 62 along with the phase difference received from first unit 14. Second unit 16 then calculates the difference between the phase angle differences of units 14 and 16, to determine the difference in the phase between reference conductor 10 and field conductor 12. A display 64 may indicate the phase angle difference as well as the other parameters such as phase sequence and phase rotation.

Accordingly, the present invention reduces the amount of data that needs to be transmitted and the need for full- or half-duplex transmission, and optionally transmits the data at a modulation frequency so that it can be transmitted in the same manner as routine telephone conversation all in order to enable simplex transmission and even marginal quality transmission to transmit accurate phase angle information over great distances with accuracy and simplicity.

Figure 3:
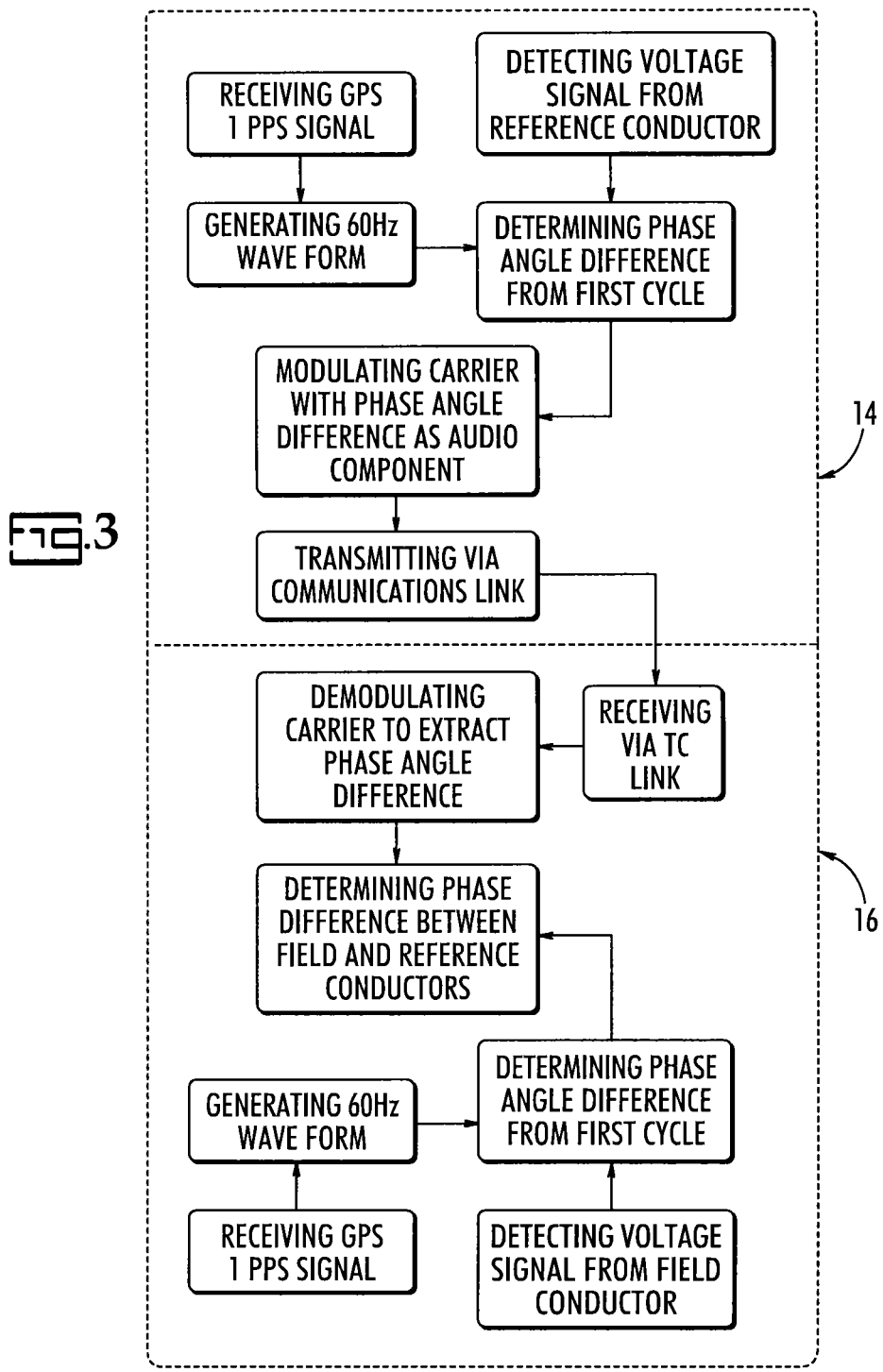
FIG. 3 is a flow diagram of the present method, according to an embodiment of the present invention.

According to the present method as illustrated in FIG. 3, the first unit receives the 1 pps GPS signal and uses it to generate a 60 Hz wave form, such as a square, sinusoidal or saw-toothed wave form with steep rise. The first unit also detects a voltage signal from the voltage carried by a reference conductor, and compares it to the 60 HZ wave form to determine the phase angle difference between the two. Meanwhile, the second unit, wherever it is with respect to the first unit, also receives a 1 pps GPS signal and uses it to generate a second, 60 Hz wave form. The second unit also detects a voltage signal from a conductor in the field and determines the phase angle difference between the 60 Hz wave form and the voltage signal from the field conductor.

In first unit 14, the phase angle difference between the 60 Hz wave form and the reference voltage signal on the reference conductor is digitized and used to modulate a radio-frequency carrier wave that is then transmitted via a telecommunications link to second unit 16.

In second unit 16, the radio-frequency carrier wave is demodulated and the phase angle difference from first unit 14 is compared to the phase angle difference determined by the second unit. The difference between these two phase angle differences is the phase angle difference between the reference and the field conductors. That phase angle difference is displayed by second unit 16 for the user so that the user can tell if the voltage on the field conductor is in phase or out of phase with the voltage on the reference conductor and, if out of phase, by how much. If the field conductor voltage is 120 degrees behind the reference conductor voltage and the reference conductor has been designated the A conductor, then the field conductor is a B conductor. If the field conductor is 120 degrees ahead of the reference conductor, it is a C conductor.

It will be clear that determining instantaneous phase angle differences has a different outcome depending on whether the wave form is compared to the voltage signal or the other way around but so as long as the comparison is done consistently by each unit and consistently between first unit 14 and second unit 16, either order will produce useful results and are equivalent. Similarly, a system and method wherein the communication of the instantaneous phase angle difference of the field conductor is transmitted from second unit 16 to first unit 14 for comparison to the instantaneous phase angle difference of the reference conductor is also deemed equivalent to the present system.

Those skilled in the art of high-voltage measurement and transmission and grid management will appreciate that modifications and substitutions may be made to the preferred embodiments described herein without departing from the spirit and scope of the present invention, which is defined by the appended claims.

What is claimed is:

1. A method of determining the phase angle difference between a voltage signal carried by an electrical conductor in the field with respect to a reference voltage signal, said method comprising the steps of:
    (a) at a reference location, receiving a first 1 pps signal from first global positioning satellite;
    (b) generating a first wave form from said first 1 pps signal;
    (c) obtaining a voltage signal from a reference source;
    (d) determining a first instantaneous phase difference between said first wave form and said voltage signal from said reference source;
    (e) at said reference location, modulating a carrier wave with said first instantaneous phase difference;
    (f) transmitting said modulated carrier wave to said location near said electrical conductor at intervals of one second;
    receiving said modulated carrier wave at said location;
        demodulating said carrier wave to obtain said first instantaneous phase difference at a location near an electrical conductor;
    (g) at said location near said electrical conductor, receiving a second 1 pps signal from a second global positioning satellite;

(h) generating a second wave form from said second 1 pps signal;
(i) obtaining a field voltage signal from said electrical conductor;
(j) determining a second instantaneous phase difference from said second wave form signal and said field voltage signal; and
(k) determining a phase angle difference between said first and second instantaneous phase differences, said phase angle difference between said first and said second instantaneous phase angle differences being the phase angle difference between said reference voltage signal from said reference source and said field voltage signal carried by said electrical conductor in the field.

2. The method as recited in claim 1, wherein said carrier wave is a radio frequency wave and wherein said modulating step further comprises applying said first instantaneous phase difference as an audio spectrum signal to said radio frequency wave.

3. The method as recited in claim 2, wherein said carrier wave is modulated by frequency shift keying, dual tone multi-frequency, audio frequency spread spectrum, or synthesized speech.

4. A system for determining the phase angle difference between a voltage carried by an electrical conductor in the field with respect to a reference voltage, said system comprising:
(a) a first unit in electrical connection with a time-varying reference voltage, said first unit having
  (i) a first GPS receiver producing a one pps signal,
  (ii) a first universal frequency source generator generating a first wave form from said one pps signal from said first GPS receiver, and
  (iii) a first phase angle comparator determining a first instantaneous phase angle difference between said first wave form and said reference voltage; and
(b) a second unit near an electrical conductor, said second unit having
  (i) a source generating a voltage signal representing a time-varying voltage carried by said electrical conductor,
  (ii) a second GPS receiver producing a one pps signal,
  (iii) a second universal frequency source generator generating a second wave form from said one pps signal from said second GPS receiver,
  (iv) a second phase angle comparator determining a second instantaneous phase angle difference between said second wave form and said voltage signal generated by said source, and
  (v) a third phase angle comparator determining said phase angle difference between said first and said second instantaneous phase angle differences, said phase angle difference between said first and said second instantaneous phase angle differences being the phase angle difference between said voltage on said electrical conductor and said reference voltage.

5. The system of claim 4 further comprising:
(a) an encoder in electrical communication with said first phase angle comparator and carried by said first unit, said encoder encoding said first instantaneous phase angle difference and outputting an encoded phase angle signal;
(b) a modulator carried by said first unit and in electrical connection with said encoder, said modulator modulating a carrier wave with said encoded phase angle signal;
(c) a transmitter carried by said first unit for transmitting said modulated carrier wave;
(d) a receiver carried by said second unit, said receiver receiving said carrier wave transmitted by said transmitter;
(e) a demodulator carried by said second unit and in electrical communication with said receiver, said demodulator outputting said encoded phase angle signal; and
(f) a decoder carried by said second unit and in electrical connection with said demodulator, said decoder decoding said encoded phase angle signal and outputting said instantaneous phase angle difference from said first unit to said third phase angle comparator.

6. The system as recited in claim 5, wherein said carrier wave is a radio frequency carrier wave.

7. The system as recited in claim 5, wherein said modulator modulates said carrier wave using an audible signal.

8. The system as recited in claim 5, wherein said modulator modulates said carrier wave using frequency shift keying, dual tone multi-frequency, audio frequency spread spectrum, or synthesized speech.

9. The system as recited in claim 5, wherein said transmitter is a simplex transmitter.

10. The system as recited in claim 5, wherein said transmitter transmits said modulated carrier wave at a regular interval.

11. The system as recited in claim 10, wherein said interval is one second.

12. The system as recited in claim 5, wherein said phase angle difference is represented by not more than nine digital bits.

\* \* \* \* \*